(12) United States Patent
Larsson et al.

(10) Patent No.: US 7,043,520 B2
(45) Date of Patent: May 9, 2006

(54) HIGH-SPEED/LOW POWER FINITE IMPULSE RESPONSE FILTER

(75) Inventors: Patrik Larsson, Matawan, NJ (US); Christopher John Nicol, West Pymble (AU)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/724,506

(22) Filed: Nov. 29, 2003

(65) Prior Publication Data

US 2004/0117424 A1  Jun. 17, 2004

Related U.S. Application Data

(62) Division of application No. 09/526,836, filed on Mar. 16, 2000, now Pat. No. 6,687,722.

(51) Int. Cl.
 *G06F 7/52* (2006.01)
(52) U.S. Cl. .................................................. 708/629
(58) Field of Classification Search ......... 708/629–630
 See application file for complete search history.

(56) References Cited

U.S. PATENT DOCUMENTS

| | | | | |
|---|---|---|---|---|
| 4,463,439 A | * | 7/1984 | Weinberger | 708/703 |
| 4,769,780 A | * | 9/1988 | Chang | 708/629 |
| 4,791,601 A | * | 12/1988 | Tanaka | 708/630 |
| 4,799,183 A | * | 1/1989 | Nakano et al. | 708/629 |
| 5,253,195 A | * | 10/1993 | Broker et al. | 708/629 |
| 5,257,217 A | * | 10/1993 | Chiu | 708/629 |
| 5,325,320 A | * | 6/1994 | Chiu | 708/629 |
| 5,327,368 A | * | 7/1994 | Eustace et al. | 708/625 |
| 5,333,119 A | * | 7/1994 | Raatz et al. | 708/630 |
| 5,808,928 A | * | 9/1998 | Miyoshi | 708/629 |
| 5,914,892 A | * | 6/1999 | Wang et al. | 708/626 |
| 5,943,250 A | * | 8/1999 | Kim et al. | 708/629 |
| 6,018,758 A | * | 1/2000 | Griesbach et al. | 708/606 |
| 6,615,229 B1 | * | 9/2003 | Vijayrao et al. | 708/629 |
| 6,665,691 B1 | * | 12/2003 | Hossain | 708/210 |

* cited by examiner

*Primary Examiner*—Tan V. Mai (57) ABSTRACT

A partial carry-save format is employed for a finite impulse response filter output representation, thereby reducing a number of flip-flops and hence power. By replacing the least significant bit processing section on the output side of the finite impulse response filter with a combined carry-save adder and carry-propagate adder followed by a register rather than two flip-flops, the present invention reduces the load on the clock and achieves reduced propagation delay. To further improve the performance of the finite impulse response filter, a simpler carry-save adder is employed in the least significant bit section, which is possible due to the use of a single register at an input to each of the carry-save adders rather than two flip-flops, one for a carry output and one for a sum output from the adder. The combination of a reduction of half of the flip-flops and a replacement of a simpler carry-save adder for each of the carry-save adders results in a significant improvement in the overall filter performance and power and space consumption.

4 Claims, 6 Drawing Sheets

HIGH-SPEED/LOW POWER FINITE IMPULSE RESPONSE FILTER

CROSS-REFERENCE TO RELATED APPLICATIONS

This is a divisional application of the U.S. patent application Ser. No. 09/526,836 filed Mar. 16, 2000 now U.S. Pat. No. 6,687,722.

BACKGROUND OF THE INVENTION

The present invention relates generally to methods and apparatuses for performing finite impulse response (FIR) filter operations, and more particularly to a method and apparatus for performing a finite impulse response filter operation that consumes low power without degrading the FIR filter's performance.

Modem applications require low cost chips containing integrated FIR filters. The widely known and understood FIR filter essentially performs a sum-of-products computation, In Very Large Scale Integration architectures, a fast FIR filter normally contains a set of multipliers to weight the input samples by the filter coefficients and a set of adders to accumulate the multiplier results. Given that hardware multipliers are essentially the addition of multiple partial products, the multiplier is often combined with the adders to make the FIR filter structure.

A well-known technique for accumulating several numbers is to use a carry-save format. A carry-save adder (CSA) does not propagate the (parry in the normal manner but rather stores the carry in a separate vector. Carry-save adders are faster and more efficient than carry-propagate adders (CPA). Carry-save adders arc normally configured with each adder taking four operand vectors and producing two result vectors (a sum and a carry vector).

Figure 1:
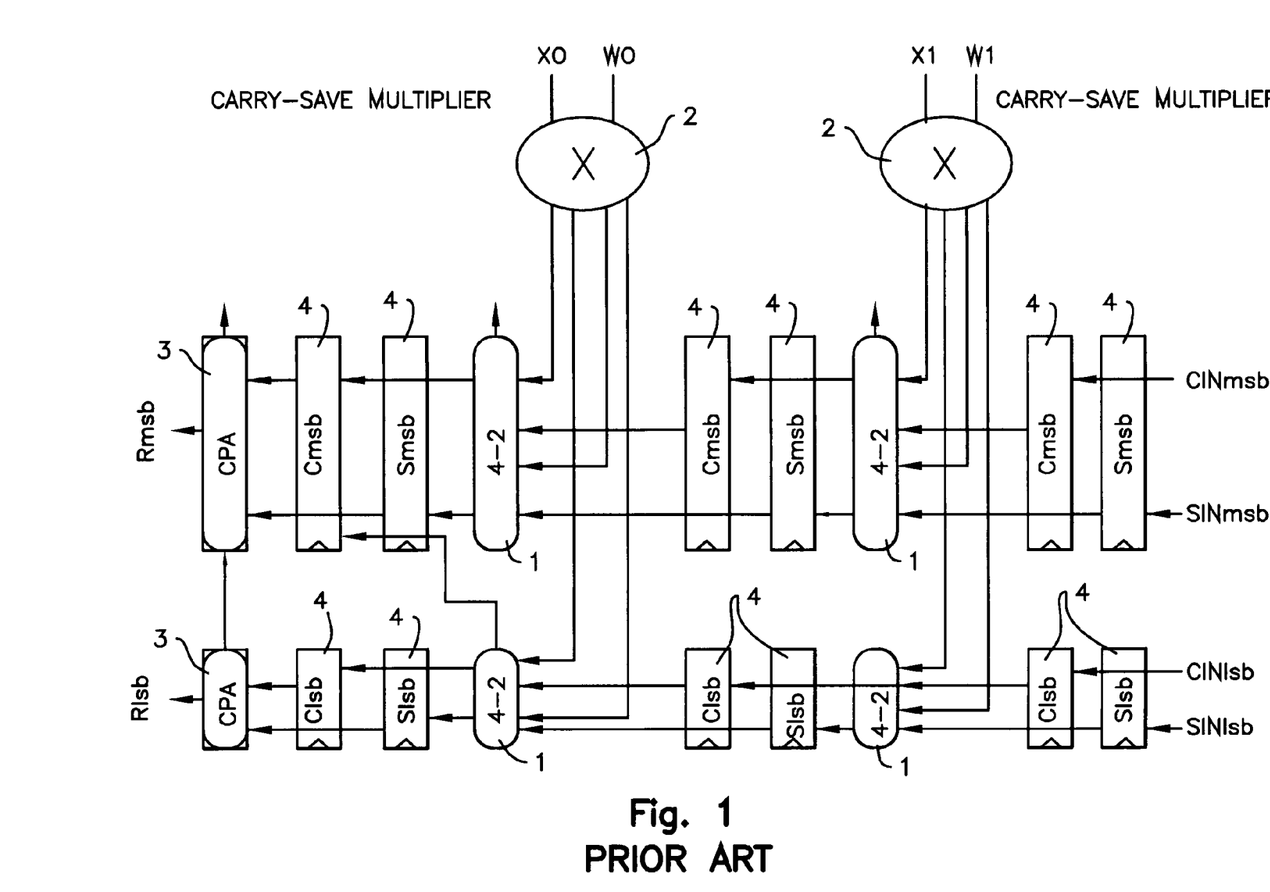
FIG. 1 depicts a carry-save format to accumulate the multiplier outputs in a finite impulse response (FIR) filter according to a conventional configuration.

In FIG. 1, carry-save adders 1 are used to add together the outputs of several multipliers 2, each of which outputs a result in carry-save format. Each carry-save adder 1 adds two numbers in carry-save format—one from the multiplier 2 and the other from the previous carry-save adder 1, the output of which is stored in flip-flops 4. In FIG. 1, the carry-save adders 1 are indicated as "4-2" meaning four inputs and two Outputs At the output of the filter there are only two vectors to be added together, at which point a single carry-propagate adder 3 is used to compute the final result. In FIG. 1, the vectors are partitioned into most significant bit (MSB) and least significant bit (LSB) components for later comparison. In high-speed filters, the transposed FIR form is commonly used to achieve the highest performance because the series adders are populated with flip-flops 4 to enable each multiply-add operation to take a complete clock cycle to execute. This filter structure contains flip-flops 4 in the output accumulation path. Because the results are stored in carry-save format, there are actually two flip-flops 4 per bit of precision in the output path (one for the sum bit and one for the carry bit), The flip-flops 4 are shown as registers in FIG. 1 and marked Clsb/Cmsb and Slsb/Smsb for carry least significant bit/most significant bit and sum least significant bit/sum most significant bit, respectively.

The advantages with carry-save arithmetic include reduced propagation delay, reduced integration area and reduced power dissipation because one adder is eliminated at each multiplier output. A disadvantage is that more flip-flops are needed when pipelining the carry-save filter accumulation paths. These additional flip-flops lead to increased power consumption mainly due to increased current drain on the source of the clock signal.

The present invention is therefore directed to the problem of developing a method and apparatus for performing an FIR filter operation without consuming much power and without any degradation in filter performance while maintaining reduced propagation delay.

SUMMARY OF THE INVENTION

The present invention solves this problem by using a partial carry-save format for the filter output representation thereby reducing the number of flip-flops or registers and hence the power. By replacing the least significant bit processing section on the output side of the finite impulse response (FIR) filter with a combined carry-save adder and carry-propagate adder followed by a single register rather than two registers or flip-flops, the present invention reduces the load on the clock and achieves a reduced propagation delay.

To further improve the performance of the FIR filter, the present invention employs a simpler carry-save adder than heretofore was possible by using a single register at the input to each of the carry-save adders in the least significant bit portion rather than two registers or flip-flops, one for the carry and one for the sum. The combination of a reduction of half of the registers or flip-flops and a concomitant replacement of a simpler carry-save adder for each of the carry-save adders results in a significant improvement in the overall filter performance.

DETAILED DESCRIPTION

Figure 2:
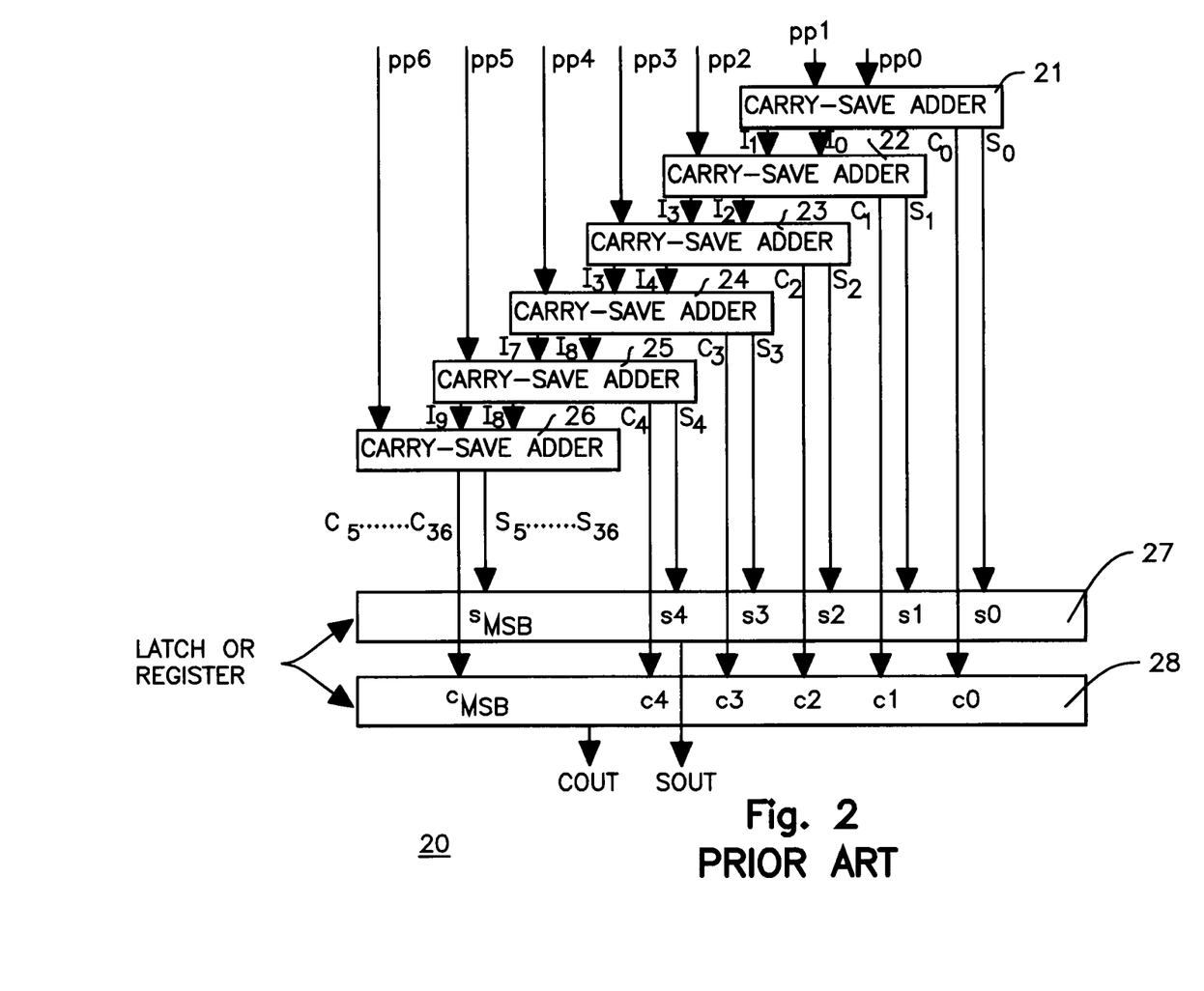
FIG. 2 depicts a carry-save multiplier showing propagation delays according to a conventional configuration.

One aspect of the present invention involves improving the speed of a multiplier. As the inventors have recognized, the propagation delays through a multiplier circuit are not equal. Therefore, the individual bits of the result will arrive at different times even though the inputs might arrive simultaneously. The reason for this is demonstrated in FIG. 2. FIG. 2 depicts a conventional carry-save multiplier 20. Carry-save adders 21–26 add pairs of partial products (PP0–PP6) and the intermediate values (10–19) from earlier carry-save adders 22–26. PP0–PP6 are vectors whose length depends on the size of the overall carry-save multiplier. For example, if CSA 20 is a 32-bit output multiplier, PP0 through PP6 are each 32-bit wide vectors (bits 0–31). Moreover, vectors 10 through 19 are 31-bit wide vectors (bits 0–30), as the remaining bits are output directly to the registers 27, 28. The output of carry-save adder 26 is two 32-bit vectors CMSB and SMSB.

The outputs of the carry-save adders 21–26 are accumulated in registers 27, 28. If the output is a 32-bit value, then each register 27, 28 will contain 37 bits. The partial products (PPs) in a multiplier are all shifted before they are added, because a multiplication is essentially a shift-add operation. The least-significant bits (LSBs) of the result are computed from the addition of fewer partial products than the middle bits (e.g., S0 is derived from PP0, whereas S4 is derived from PP0, PP1, PP2, PP3 and PP4). Therefore, the evaluation of S0 is completed earlier than S4 because it has a simpler Boolean function. The early arrival of the least significant bits in a multiplier can be exploited to reduce the number of flip-flops by incorporating the least significant bits of a carry-propagate adder into the least significant bit portions of the multiplier itself, The least significant bits of the carry-propagate adder are simply a ripple-carry adder and the most significant bits are computed using a faster, more parallel structure (such as carry-select, carry-skip or look-ahead adder, for example). By placing the least significant bits of a carry-propagate adder into the multiplier, only a single flip-flop is needed for each of the least significant bits. This concept is demonstrated in FIG. 3, which depicts a multiplier 30 according to one aspect of the present invention.

Figure 3:
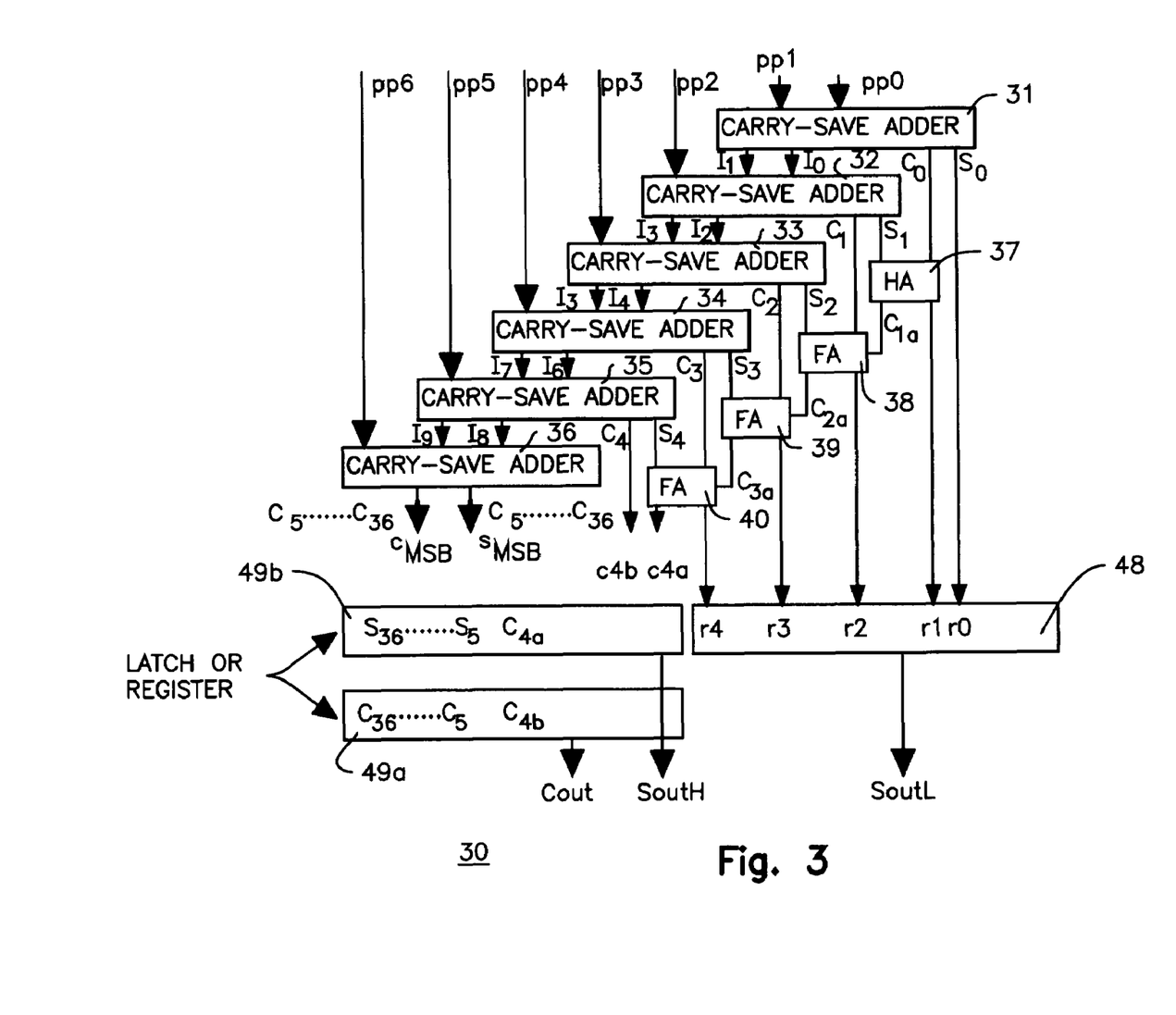
FIG. 3 depicts an exemplary embodiment of pipeline retiring of a multiplier according to one aspect of the present invention.

Referring to FIG. 3, the sum and carry vectors are partitioned into most significant bit and least significant bit components. The least significant bit components are fed into ripple-carry adders 37–40. The carry-output of the adders 37–40 becomes the bit 0 (c4a) of the most-significant carry vector. The SUM outputs of the ripple carry adder become the SoutL, bits of the result, which are accumulated in a register 43. As in the above implementation, the remaining bits are accumulated in registers 49a, 49b.

In sum, the carry and save registers 49a, 49b which relate to the least significant bits have been replaced with a single register 48 and a carry-propagate adder comprised of full adders 38–40 and half adder 37. The result is a faster, lower power multiplier 30.

According to another aspect of the present invention, the application of the above pipeline retiming in a multiplier is applied to a finite impulse response filter, as shown in FIG. 1. The end result is shown in exemplary embodiment of FIG. 4.

Figure 4:
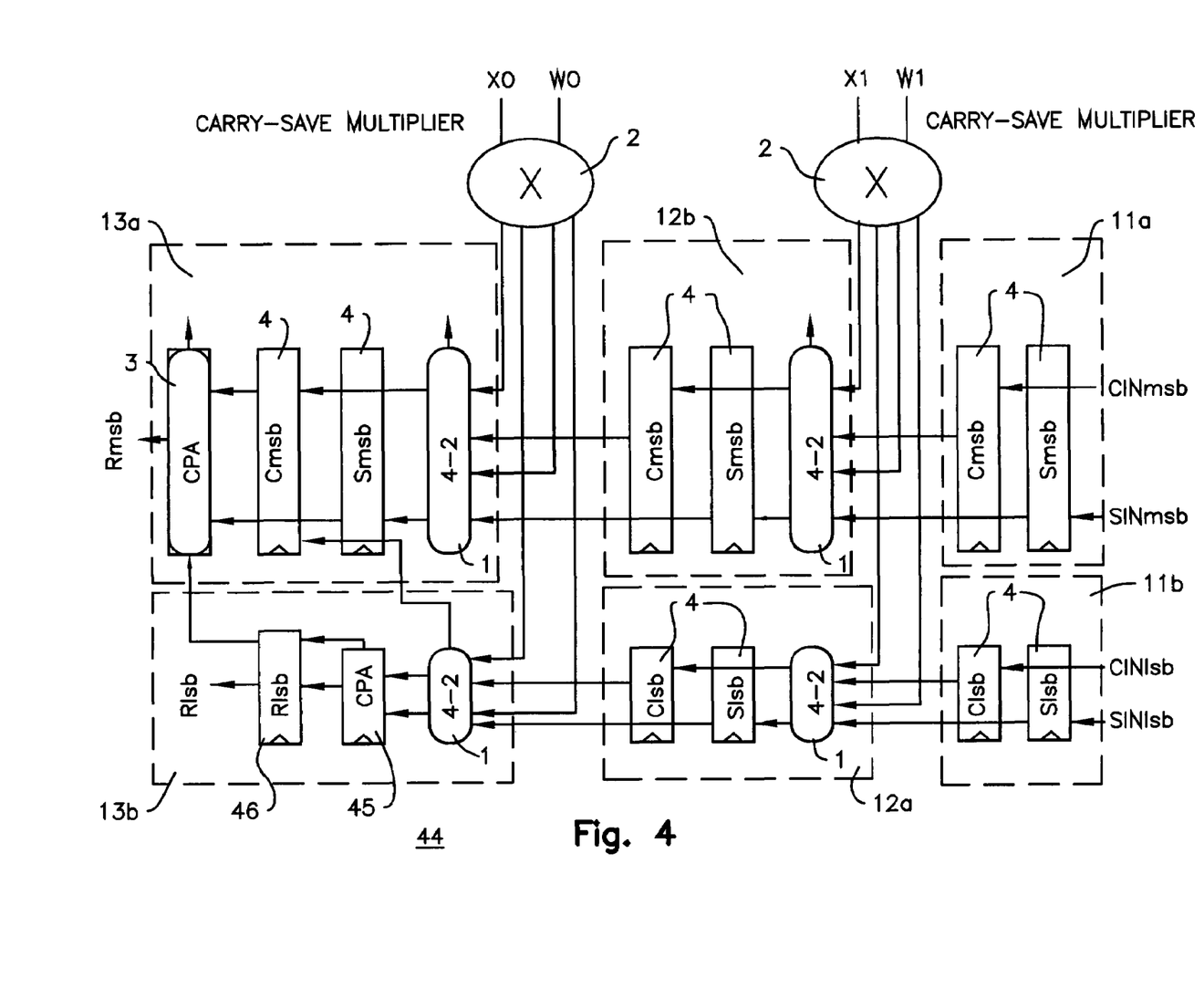
FIG. 4 depicts an exemplary embodiment of a pipeline retiring of a finite impulse response filter according to one aspect of the present invention.

Turning to FIG. 4, FIR filter 44 includes an input stage 11 having a most signification (MSB) section 11a and a least significant bit (LSB) section 11b Following the input stage 11 is a carry-save adder stage 12, which has an LSB section 12a and an MSB section 12b. On the output sides the FIR filter 44 includes a carry-save adder/carry-propagate adder stage 13 which has an LSB section 13a and an MSB section 13b. The LSB section 13b of the carry-save adder/carry-propagate adder stage 13 is modified to include a carry-save adder 1 followed by a carry-propagate adder 45, which is in turn followed by a single register 46 rather than two registers or flip-flops.

The application of pipeline retiming to the finite impulse response filter in FIG. 1 produces the structure 44 in FIG. 4. The least significant bits of the carry propagate adder on the output of the filter have been relocated into the least significant bits of the carry-save adder in the accumulation path. To aid in comparing the structure in FIG. 1 to the structure in FIG. 4, the same reference numerals used in FIG. 1 are used in FIG. 4 to refer to the same elements. The end result of embodiment 44 is that the output of the carry-save adder 1 is fed directly into the carry propagate adder 45, whose output in turn is accumulated in a single register 46. Thus, at a minimum, a single register is saved on each stage of the least significant bit section.

Figure 5:
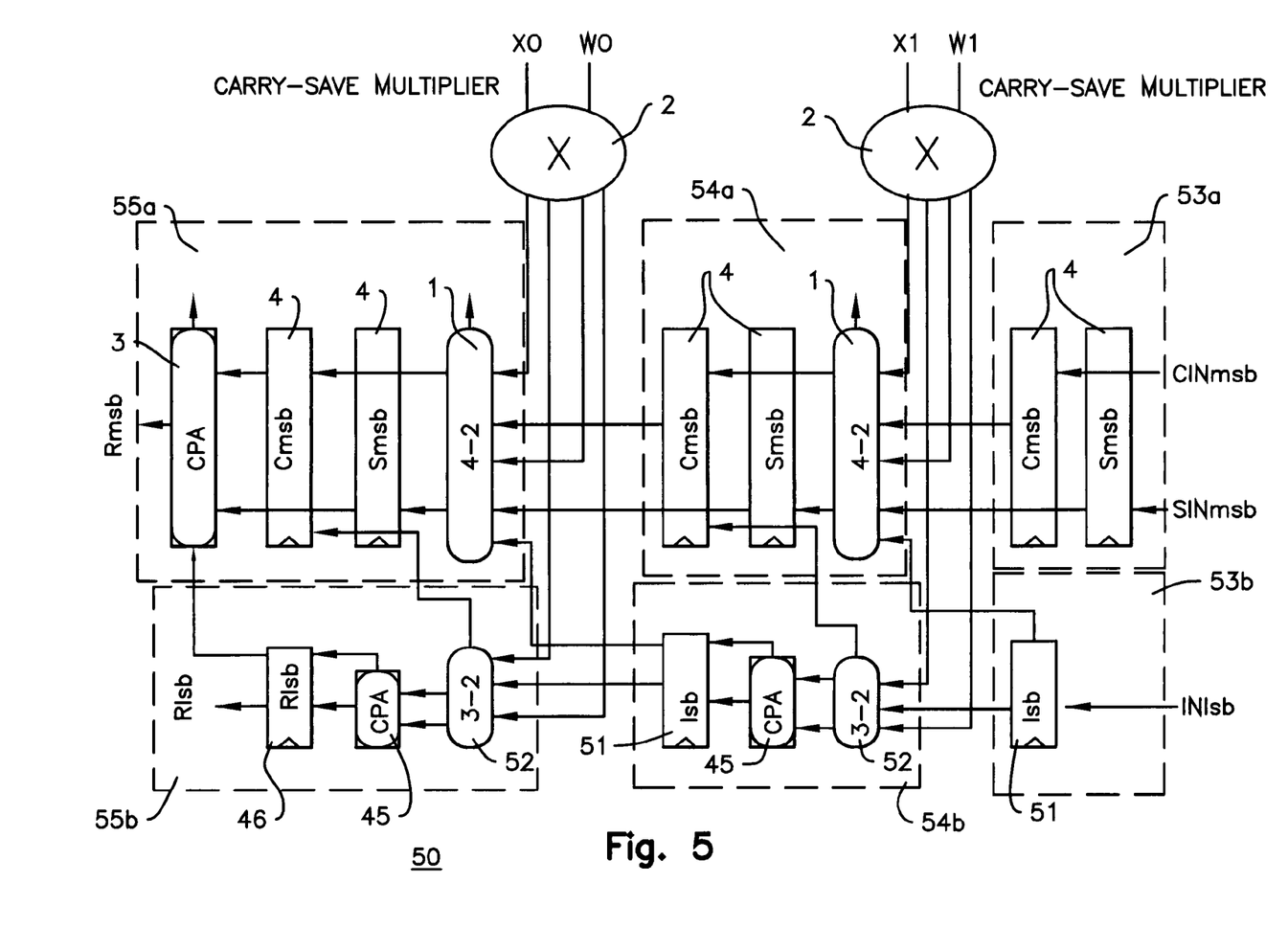
FIG. 5 depicts an exemplary embodiment of a finite impulse response filter structure according to one aspect of the present invention.

An exemplary embodiment 50 of one aspect of the present invention is drawn in FIG. 5. To aid in comparing the structure in FIG. 1 and FIG. 4 to the structure in FIG. 5, the same reference numerals used in FIG. 1 and FIG. 4 are used in FIG. 5 to refer to the same elements. The FIR filter 50 includes an input stage 53, which has an MSB section 53a and an LSB section 53b. Following the input stage 53 is a carry-save adder/carry-propagate adder stage 54, which has an MSB section 54a and an LSB section 54b. On the output side of the filter 50, there is another carry-save adder/carry-propagate adder stage 55, which has an-MSB section 55a and an LSB section 55b.

The least significant bits of every accumulate stage in the filter 50 are replaced by a 3-2 carry-save adder 52 (rather than a 4-2 carry save adder 1 used in FIG. 1 and FIG. 4) and the outputs of the 3-2 carry-save adder 52 are added together in a carry-propagate adder 45 (similar to that in FIG. 4). This embodiment 50 has the advantage of fewer 4-2 carry save adders (the complexity of a 4-2 carry save adder is approximately twice the complexity of a 3-2 carry save adder), and fewer flip-flops (three registers or flip-flips 4 in the LSB section of the FIR of FIG, 5 versus six registers or flip-flops 4 in the LSB section of the FIR of FIG. 1). Moreover, this reduction in power consumption is achieved without any degradation in speed.

Figure 6:
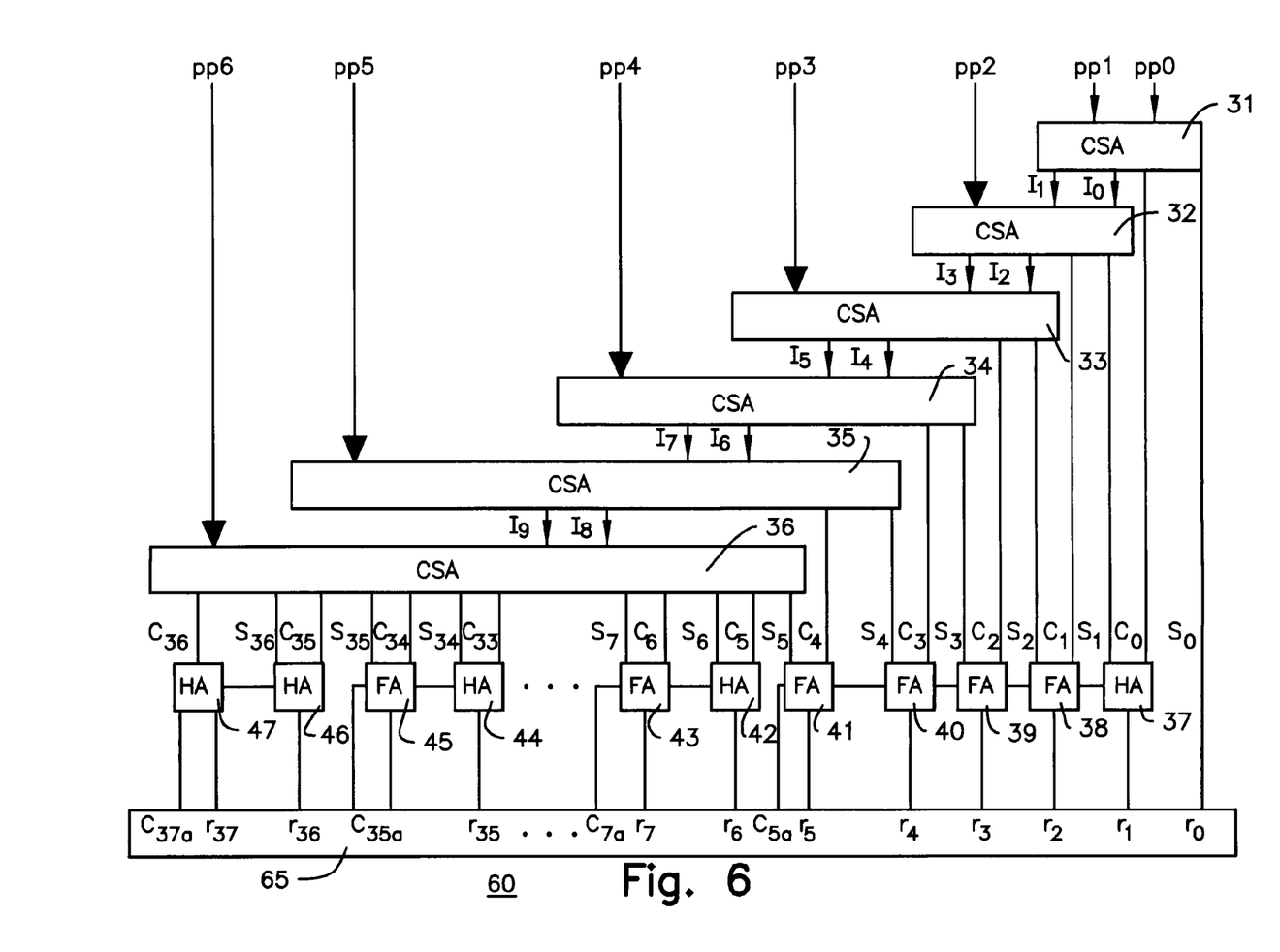
FIG. 6 depicts an exemplary embodiment of another aspect of the present invention, in which a number of flip-flops in the most significant bit path is reduced.

If some speed degradation is acceptable, some of the Cmsb and Smsb bits can also be reduced. One such implementation 60 is shown in FIG. 6, which saves 25% of the registers, as each group of four bits is reduced to three. For example, bits s7, c6, s6 and c5 are converted to bits c7a, r7 and r6, respectively, by adders 43 and 42. Adder pairs 44, 45 and 46, 47 perform similar functions for their inputs. The adder pairs repeat depending upon the length of the multiplier 60. The last two three bits output by carry-save adder 36 are the sum bit s36, carry bit can and carry bit c35, which are converted into c37a, r37 and r36 by adders 46, 47 as shown in FIG. 6.

As shown in FIG. 6, the registers 49a, 49b of FIG. 3, are replaced with adders 41–47, and a single output register 65. Output register 65 can be either a single register, combining registers 49a, 49b and 48 or two registers, one for the least significant bits, such as register 48, and another for the most significant bits. The output of the adders 41–47 are fed into the single MSB output register 65, thereby reducing the number of registers by at least one for each stage. The inputs to the adders 41–47 are from the carry-save adders 35 and 36 as shown in FIG. 6. The inputs to adders 37–40 remain as shown in FIG. 3. Thus, bit r5 comes directly from adder 41 and carry bit c5a also comes from adder 41. The output from half-adder 42 is r6. The output from full-adder 43 is bit r7 and carry bit c7a At the end of the register, the output from half-adder 47 is 1–37 and a carry bit c37a; and the output from half-adder 46 is r36 The output from full-adder 45 is carry bit c35a, and result bit r35 Result bit r34 comes from half-adder 44. The half-adder/full adder combination repeats as shown in FIG. 6, depending upon the length of the multiplier 60. In a 32-bit multiplier, the end result is each 4-bit group output by carry-save adder 36 is converted into a 3-bit group and stored in a register, thereby reducing the number of bits in the register from a total of 64 bits (i.e., two registers 27, 28 times 32-bits stored in each register) to 48 bits (i.e., one register storing 16 groups of 3-bits). Thus saving 25% of the memory requirements, for a small speed degradation.

For a tree multiplier, it can be shown that some of the most significant bits can be reduced with the structure in FIG. 6 without speed penalty. For filters with many taps, it is customary to have an adder with more bits than the multiplier output to avoid overflow and underflow checking. In this case, the most significant bits that extend beyond the multiplier output can be reduced significantly without delay penalty.

According to another aspect of the present invention, a method for performing a finite impulse response filter operation reduces the number of registers or flip-flops required by receiving a least significant bit input with a single input register. On the most significant bit section, two registers or flip-flops are used, one for a most significant bit carry input and one for a most significant bit sum input. In the adder sections, a carry-save adder coupled to a carry-propagate adder coupled to a single register is employed in each adding stage in a least significant bit portion of the finite impulse response filter. In the most significant bit portion of the finite impulse response filter in each adding stage, a carry-save adder coupled to two flip-flops, one for a carry output and one for a sum outputs is employed.

The above architecture permits the use of a carry-save adder with fewer inputs in the least significant bit portion of the finite impulse response filter than the carry-save adder in the most significant bit portion of the finite impulse response filter. For example, the carry-save adder in the least significant bit portion of the finite impulse response filter may consist of a 3-2 carry-save adder, whereas the carry-save adder in the most significant bit portion of the finite impulse response filter may consist of a 4-2 carry-save adder.

What is claimed is:

1. An apparatus for adding a plurality of partial products comprising:
    a plurality of carry-save adders coupled toaether in series, each of the plurality of carry-save adders receiving a successive one of the plurality of rartial products and two intermediate vectors (In−1, In−2) from a prior carry-save adder in the series of carry-save adders and each of the plurality of carry-save adders outputting a carry bit (Cn−1), a sum bit (Sn−1) and two intermediate vectors (In, In+1), wherein a first one in the series of carry-save adders receives two of the plurality of partial products;
    a last carry-save adder coupled to a last one in the series of carry-save adders, receiving a last one of the plurality of partial products and two intermediate vectors from said last one in the series of carry-save adders, and outputting a plurality of sum bits and a plurality of carry bits;
    a plurality of half-adder/full-adder series combinations coupled to the last carry-save adder, each of the plurality of half-adder/full-adder series combinations receiving two carry bits of the plurality of carry bits output by the last carry-save adder and two sum bits of the plurality of sum bits output by the last carry-save adder, and outputting two result bits and a carry bit; and
    two half-adders coupled together in series and coupled to the last carry-save adder, said two half-adders receiving from the last cany-save adder two most significant carry bits and a most significant sum bit and outputting two result bits and a carry bit as a plurality of most significant bits of the result of adding the plurality of partial products.

2. The apparatus according to claim 1, further comprising a single output register coupled to the plurality of half-adder/full-adder combinations and storing the two result bits and the carry bit output by each of the plurality of half-adder/full-adder series combinations.

3. A method of improving the speed of a multiplier comprising the steps of:
    partitioning sum and carry vectors into most significant bit and least significant bit components;
    feeding the least significant bit components into a set of ripple-carry adders; and
    using a single register in an accumulation stage to accumulate the bits relating to the least significant bit components.

4. The method of claim 3 wherein the set of ripple-carry adders includes full-adders and a half-adder.

* * * * *

UNITED STATES PATENT AND TRADEMARK OFFICE
CERTIFICATE OF CORRECTION

| | | |
|---|---|---|
| PATENT NO. | : 7,043,520 B2 | |
| APPLICATION NO. | : 10/724506 | |
| DATED | : May 9, 2006 | |
| INVENTOR(S) | : P. Larsson et al. | |

It is certified that error appears in the above-identified patent and that said Letters Patent is hereby corrected as shown below:

Claim 1, col. 5, line 38, delete "toaether" and insert --together--.

Claim 1, col. 5, line 40, delete "rartial" and insert --partial--.

Signed and Sealed this

Eighth Day of August, 2006

JON W. DUDAS
*Director of the United States Patent and Trademark Office*